United States Patent [19]
Nakayama et al.

[11] Patent Number: 5,996,543
[45] Date of Patent: Dec. 7, 1999

[54] INTAKE DEVICE TO WHICH ENGINE ECU IS FIXED AND METHOD OF ASSEMBLING THE SAME

[75] Inventors: Toshiaki Nakayama, Nishikamo-gun; Takashi Ishida, Okazaki, both of Japan

[73] Assignee: Denso Corporation, Kariya, Japan

[21] Appl. No.: 09/049,924

[22] Filed: Mar. 30, 1998

[30] Foreign Application Priority Data

Mar. 28, 1997 [JP] Japan .................................. 9-077289

[51] Int. Cl.$^6$ .................................................. F02M 35/00
[52] U.S. Cl. .............................. 123/184.21; 123/184.61
[58] Field of Search ...................... 123/184.21, 184.24, 123/184.34, 184.42, 184.47, 184.61, 198 R, 198 E; 361/678, 600

[56] References Cited

U.S. PATENT DOCUMENTS

| | | | |
|---|---|---|---|
| 4,719,891 | 1/1988 | Porth et al. ............................... | 123/454 |
| 5,117,932 | 6/1992 | Kurosu et al. ............................ | 180/68.2 |
| 5,207,186 | 5/1993 | Okita ...................................... | 123/4.31 |
| 5,638,784 | 6/1997 | Ohsuga et al. ....................... | 123/184.34 |
| 5,664,533 | 9/1997 | Nakayama et al. ................. | 123/184.42 |
| 5,713,322 | 2/1998 | Mausner et al. ..................... | 123/184.21 |
| 5,751,058 | 5/1998 | Matsuki .................................... | 257/652 |
| 5,816,213 | 10/1998 | Gavaini et al. ...................... | 123/198 E |

*Primary Examiner*—Noah P. Kamen
*Assistant Examiner*—Hai Huynh
*Attorney, Agent, or Firm*—Nixon & Vanderhye P.C.

[57] ABSTRACT

An ECU for an engine is held in a circuit holding member provided in an air cleaner cap of an intake device. A space between the ECU and the circuit holding member is filled with a potting material, so that the ECU is fixed to the circuit holding member. As a result, the ECU can have high shakeproof properties not to cause malfunctions and not to be damaged by vibrations.

8 Claims, 4 Drawing Sheets

INTAKE DEVICE TO WHICH ENGINE ECU IS FIXED AND METHOD OF ASSEMBLING THE SAME

CROSS REFERENCE TO RELATED APPLICATION

This application is based upon and claims the benefit of priority of the prior Japanese Patent Application No. 9-77289 filed on Mar. 28, 1997, the contents of which are incorporated herein by reference.

BACKGROUND OF THE INVENTION

1. Field of the Invention

The present invention relates to an intake device to which an electronic control unit (ECU) for controlling an operational state of an internal combustion engine is fixed, and to a method of assembling the same.

2. Related Arts

A well-known intake device includes an air cleaner in which an engine ECU is disposed so as not to be adversely affected by heat from an engine. This kind of intake device is disclosed in JP-A-61-160533 and JP-A-8-210200, in which the ECU is fixed to the intake device by bolts. However, in this case, there is a probability that the bolts are loosened due to vibrations of a vehicle caused by a road surface state, a sudden start or a sudden control of a vehicle, or the like. The loosened bolts may result in malfunctions and damages of electronic parts in the ECU.

SUMMARY OF THE INVENTION

The present invention has been made in view of the above-mentioned problem and an object of the present invention is to provide an intake device capable of protecting an engine ECU from vibrations. Another object of the present invention is to provide an intake device including an air cleaner that is not invaded by foreign matters. Still another object of the present invention is to provide an intake device capable of cooling down an engine ECU. Still another object of the present invention is to provide a method of assembling an intake device capable of protecting an engine ECU from vibrations.

According to the present invention, an intake device has an element for filtering air and a case holding the element therein and having an opening portion and a circuit holding member. An ECU for an engine is disposed in the circuit holding member, and a space between the ECU and the circuit holding member is filled with a filling material so that the ECU is fixed to the circuit holding member. As a result, shakeproof properties of the ECU can be improved to prevent malfunctions and damages of electronic parts in the ECU.

When the ECU includes a circuit element and a connector electrically connected to the circuit element and protruding from the ECU, the case has an opening portion for exposing the connector outside of the case. Preferably, the circuit holding member is provided inside of the case. More preferably, the circuit holding member is disposed on a clean side where the air filtered by the element flows in the case. In this case, the air cools down the ECU.

When the intake device is composed of an air cleaner, a throttle, a surge tank, and an intake manifold, the circuit holding member is disposed at least one of the air cleaner, the throttle, the surge tank, and the intake manifold.

BRIEF DESCRIPTION OF THE DRAWINGS

These and other objects and features of the present invention will become more readily apparent from a better understanding of a preferred embodiment described below with reference to the following drawings.

DETAILED DESCRIPTION OF THE PREFERRED EMBODIMENT

Figure 1:
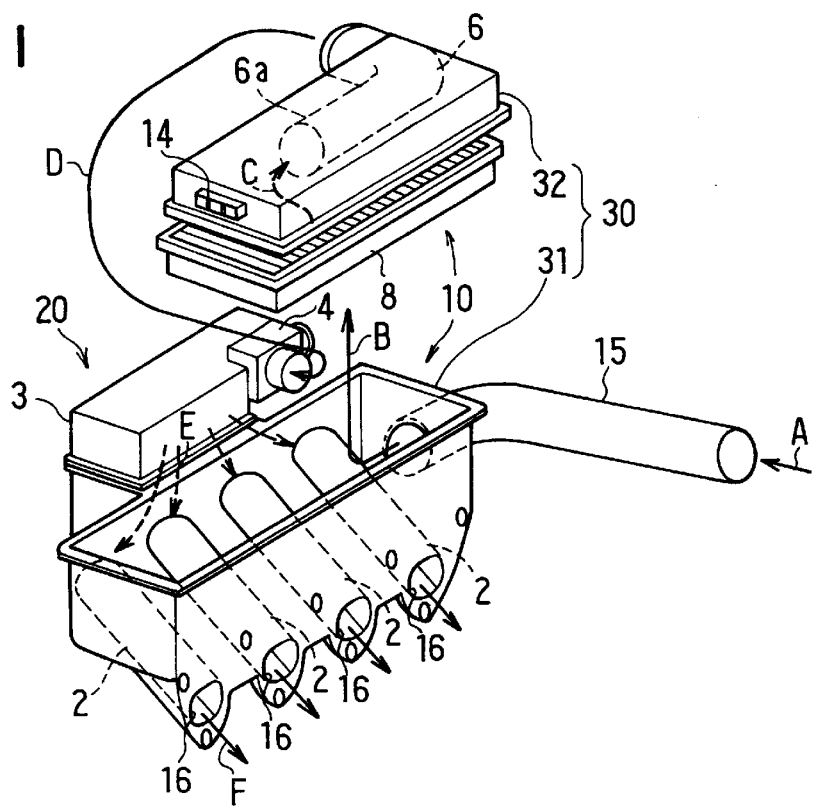
FIG. 1 is an exploded perspective view showing an intake device in the preferred embodiment of the present invention.
Figure 2:
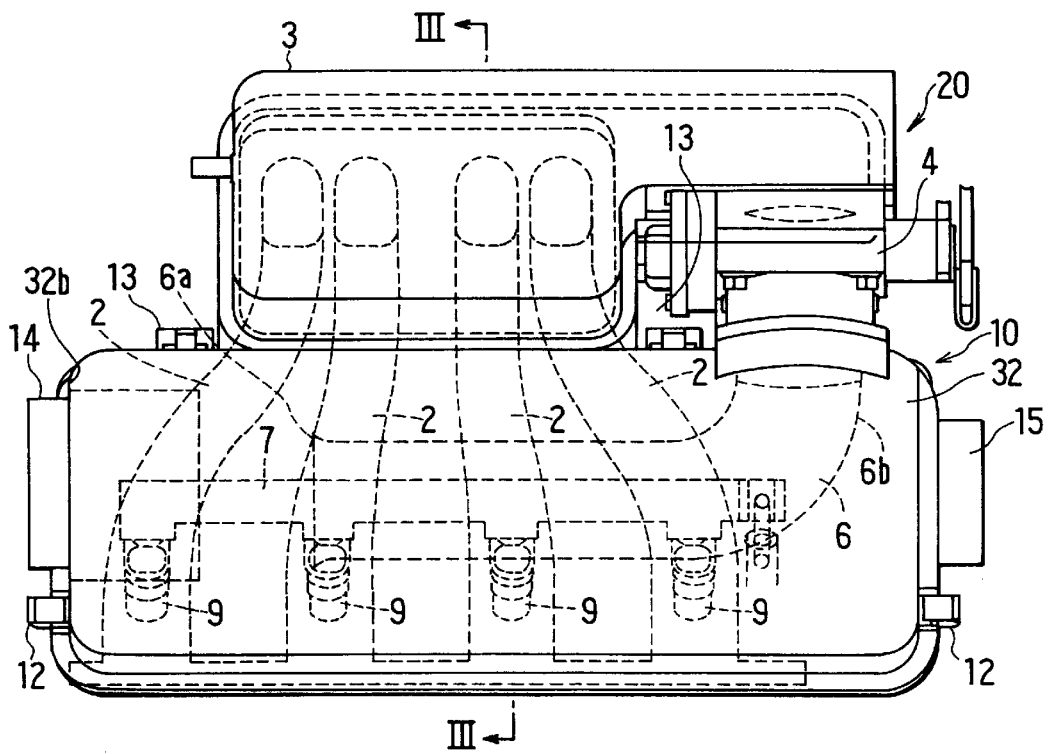
FIG. 2 is a plan view showing the intake device of FIG. 1.
Figure 3:
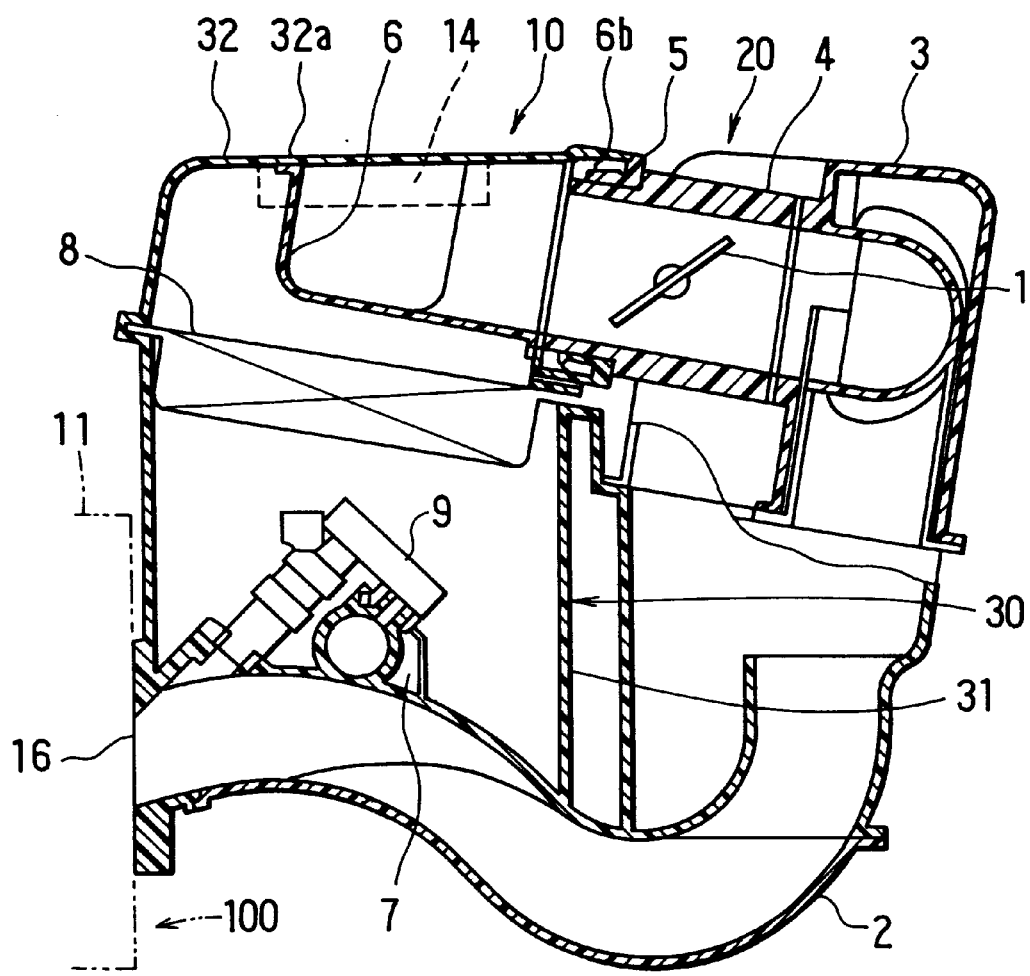
FIG. 3 is a cross-sectional view taken along a III—III line in FIG. 2.

An intake device in the preferred embodiment according to the present invention will be explained with reference to FIGS. 1 to 3. As shown in FIGS. 1 and 2, the intake device has an air cleaner 10, a throttle 20 composed of a throttle valve 1 and a throttle body 4, a surge tank 3 communicating with the air cleaner 10 through the throttle body 4, and an intake manifold 2 extending from the surge tank 3 to intake ports 16 of an engine head 11 of an engine body 100 (see FIG. 3) via the lower side of the air cleaner 10. As shown in FIG. 3, the air cleaner 10 is disposed adjacently to the engine body 100, and the throttle 20 and the surge tank 3 are disposed on the opposite side of the engine body 100 with respect to the air cleaner 10.

The air cleaner 10 has a housing 30 composed of a dusty side case 31 and an air cleaner cap 32, which are made of resin. The housing 30 extends along a row of cylinders of the engine body 100 with a width equal to or larger than an entire width of the intake manifold 2. The dusty side case 31 is formed from resin integrally with the throttle body 4 of the throttle 20 and the surge tank 30, and has an opening at the upper end thereof. As shown in FIG. 2, clamps 12 and hinges 13 are provided on the peripheral portion of the opening to fix the air cleaner cap 32 to the dusty side case 31. Further, an inlet duct 15 is connected to the dusty side case 31. Between the dusty side case 31 and the air cleaner cap 32, an element 80 for filtering air is disposed and dividing the inside of the housing 30 into a dusty side and a clean side. In FIGS. 1 and 3, the dusty side is on the lower side, while the clean side is on the upper side with respect to the element 8.

Inside of the air cleaner cap 32, a duct 6 made of resin is attached to an upper wall 32a of the air cleaner cap 32 to form a cylindrical shape in cooperation with the upper wall 32a, thereby functioning as a duct (see FIG. 3). The duct 6 has a duct inlet 6a for inhaling air therethrough. The duct inlet 6a has a bell-mouth like shape so that resistance of air inhaled into the duct 6 is reduced. The duct 6 further has a cylindrical portion 6b with a circular shape in cross-section at an end portion thereof on a throttle side, and the cylindrical portion 6b is connected to an opening of the throttle body 4 through a seal gasket 5. An end of the throttle body 4 on an opposite side of the duct 6 protrudes inside of the surge tank 3.

A flow of the air in the above-mentioned intake device is indicated by arrows A to F in FIG. 1. Specifically, the inlet duct 15 inhales air to introduce it into the dusty side case 31. The inhaled air is filtered by the element 8 and flows into the throttle body 4 through the air cleaner cap 32 and the duct 6. Then, the air passes through the surge tank 3 and is distributed into the intake manifold 2. The distributed air flows on the lower side of the dusty side case 31 in the intake manifold 2, and is supplied to the respective cylinders of the engine body 100 through the intake ports 16. The amount of the air supplied to the inlet ports 16 is controlled by the opening degree of the throttle valve 1.

On the other hand, as shown in FIGS. 2 and 3, a fuel supply system for the engine body 100, which is composed of a delivery pipe 7 and several injectors 9 corresponding to the cylinders, are retained within the dusty side case 31. Each of the injectors 9 passes through the bottom wall of the dusty side case 31, and is inserted into corresponding one of branch pipes of the intake manifold 2. In this state, each of the injectors 9 is bolted to the intake manifold 2 from the inside of the dusty side case 31. A fuel supplied to the delivery pipe 7 from a fuel supply pump (not shown) is distributed into the injectors 9, and is injected from the injectors 9 at portions adjacent to the intake ports 16 of the engine body 100.

Figure 4A:
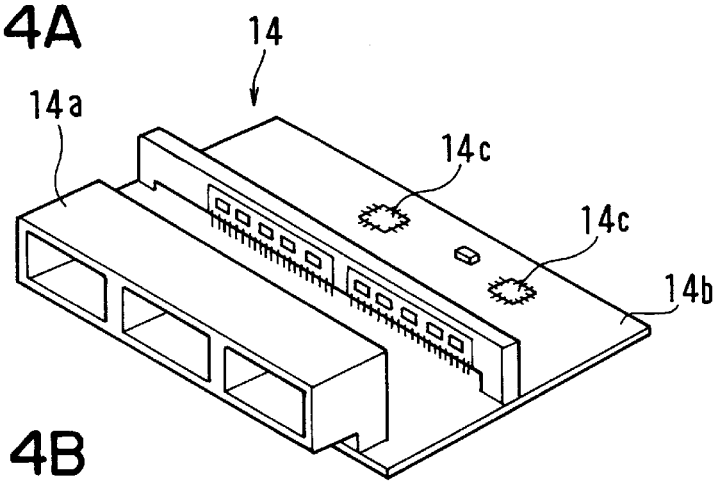
FIG. 4A is a perspective view showing an ECU in the embodiment.
Figure 4B:
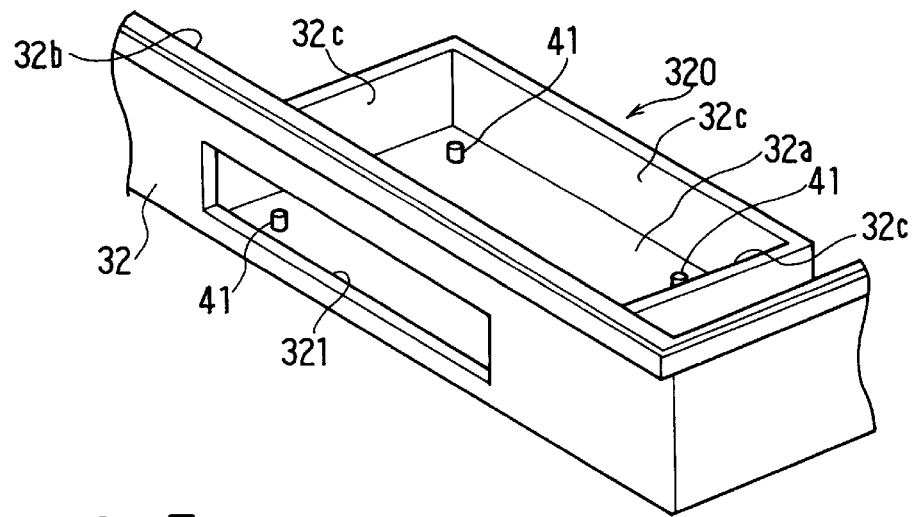
FIG. 4B is a perspective view showing a circuit holding member for holding the ECU of FIG. 4A.
Figure 5:
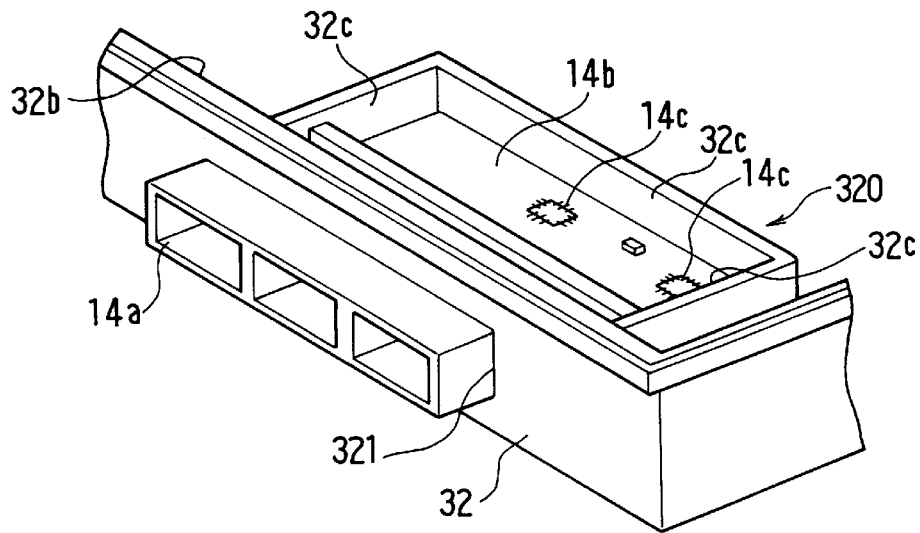
FIG. 5 is a perspective view for explaining a process of installing the ECU in the circuit holding member.

An electronic control unit (ECU) 14, which controls an operational state of the engine, the amount of the fuel injected from the injectors 9, injection timing of the fuel supply system, and the like, is held in a circuit holding member 320 and fixed to an inside side wall 32b of the air cleaner cap 32 on an opposite side of the inlet duct 15. The ECU 14 is, as shown in FIG. 4A, composed of a connector 14a, a substrate 14b, and circuit elements 14c disposed on the substrate 14b. The circuit holding member 320 is, as shown in FIG. 4B, provided on the side wall 32b of the air cleaner cap 32. The substrate 14b has an area slightly smaller than that of the bottom face of the circuit holding member 320 to make a gap with side walls of the circuit holding member 320 when it is held in the circuit holding member 320 as shown in FIG. 5. In FIGS. 4B and 5, the air cleaner cap 32 is indicated upside down as compared to that in FIGS. 1 to 3.

Figure 7:
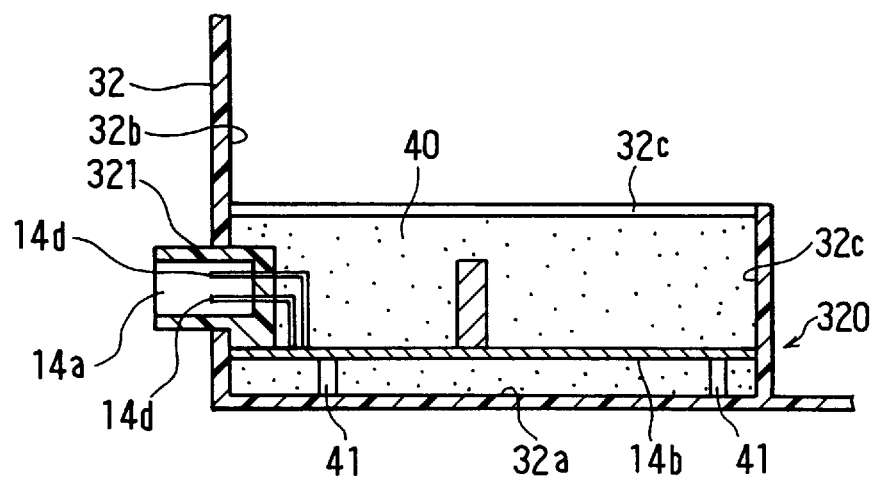
FIG. 7 is a cross-sectional view showing the ECU installed in the circuit holding member.

The circuit holding member 320 is composed of the upper wall 32a and the side wall 32b of the air cleaner cap 32 and frame walls 32c. The upper wall 32a has four protrusions 41 for receiving the substrate 14b thereon and for securing a space between the ECU 14 and the upper wall 32a. The space is filled with a potting material (filling material) made of resin in a process described below. In addition, the protrusions 41 serve as marks for positioning the ECU 14 within the circuit holding member 320. The side wall 32b serving as a part of the circuit holding member 320 has a window (opening portion) 321 therein, and the connector 14a protrudes outside of the air cleaner cap 32 from the window 321. As shown in FIG. 7, the connector 14a has several connector pins 14d electrically connected to the circuit elements 14c.

Next, processes for assembling the above-mentioned intake device, the fuel supply system, and the ECU 14 will be explained. First, the fuel supply system is installed in the dusty side case 31. As mentioned above, the dusty side case 31, the throttle body 4, and the surge tank 30 are integrally formed from resin. To the lower end of the surge tank 30 on the opposite side of the throttle body 4, the intake manifold 2 made of resin or metal is welded or bolted. Further, the ECU 14 is installed in the circuit holding member 320 of the air cleaner cap 32. The processes for installing the ECU 14 in the circuit holding member 320 are as follows.

(1) As shown in FIG. 5, the ECU 14 is placed on the protrusions 41 in the circuit holding member 320 such that the circuit elements 14c expose outside of the circuit holding member 320 and such that the connector 14a protrudes outside through the window 321.

Figure 6:
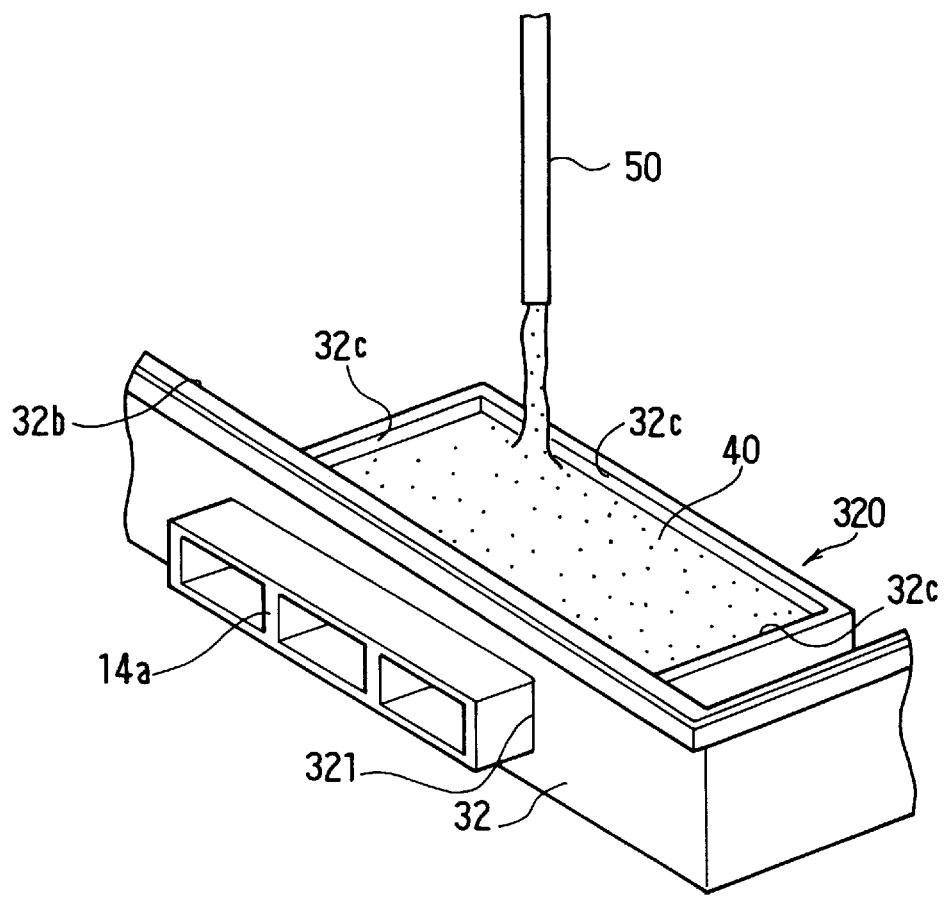
FIG. 6 is a perspective view for explaining a process of installing the ECU in the circuit holding member.

(2) As shown in FIG. 6, a fused potting material is supplied to the circuit holding member 320 retaining the ECU 14 therein by a nozzle 50. At that time, the potting material fills the space between the upper wall 32a of the circuit holding member 320 and the substrate 14b of the ECU 14.

(3) The potting material is cooled to be hardened, so that the ECU 14 is fixed to the circuit holding member 320 as shown in FIG. 7.

After installing the ECU 14 in the circuit holding member 320, the element 80 is disposed on the opening of the dusty side case 31, and then the air cleaner cap 32 is detachably mounted on the dusty side case 31 by the clamps 12 and hinges 13. Simultaneously, the cylindrical portion 6b of the duct 6 is connected to the opening of the throttle body 4. Thus, the intake device, the fuel supply system, and the ECU 14 are assembled to be a unit, and mounted on the engine body 100 as the unit.

According to this embodiment, the ECU 14 is disposed in the circuit holding member 320 of the air cleaner cap 32, and the potting material fills the circuit holding member 320 to fix the ECU 14 to the circuit holding member 320. Therefore, the ECU 14 has sufficient shakeproof properties to prevent malfunctions and damages thereof. The potting material fills the gap (space) between the connector 14a and the window 321 of the air cleaner cap 32 as well as the space between the ECU 14 and the circuit holding member 320. Therefore, despite that the connector 14a protrudes outside of the air cleaner cap 32 from the window 321, foreign matters do not invade the inside of the air cleaner cap 32. A rubber sealing member can be interposed between the connector 14a and the window 321 of the air cleaner cap 32. The sealing member can further improve the sealing property between the connector 14a and the air cleaner cap 32 in cooperation with the potting material.

Further, the ECU 14 installed in the air cleaner 10 is cooled down by air flowing in the air cleaner 10, so that over-heat of the ECU 14 caused by heat from the engine body 100 is mitigated. In addition, the ECU 14 is prevented from receiving water thereon, because it is installed in the air cleaner 10. In this embodiment, the ECU 14 can be disposed adjacently to a central portion of an engine room of the engine body 100. Therefore, lengths of harnesses for parts of the engine can be shortened.

Although the circuit holding member 320 is disposed inside of the air cleaner cap 32 in this embodiment, it may be disposed outside of the air cleaner cap 32, or inside or outside of the dusty side case 31. Otherwise, the circuit holding member 320 may be disposed on the other parts of the intake device, which is composed of the air cleaner 10, the throttle 20, the surge tank 3, and the intake manifold 2.

The ECU 14 may be held in a metallic case to be held in the circuit holding member 320. Screws can fix the ECU 14 to the circuit holding member 320 in cooperation with the potting material. The air cleaner cap 32 can have an elastic holding portion utilizing elasticity of resin constituting the air cleaner cap 32, for temporarily fixing the ECU 14 or the metallic case holding the ECU 14 to the circuit holding member 320. Accordingly, the potting material is supplied into the circuit holding member 320 in the state where the ECU 14 is temporarily fixed to circuit holding member 320. This method improves of assembling workability.

While the present invention has been shown and described with reference to the foregoing preferred embodiment, it will be apparent to those skilled in the art that changes in form and detail may be made therein without departing from the scope of the invention as defined in the appended claims.

What is claimed is:

1. An intake device for filtering air and supplying the air into an engine, the intake device comprising:

an element for filtering the air;

an electronic control unit having a circuit element and a connector electrically connected to the circuit element and protruding from the electronic control unit; and a case holding the element therein and having an opening portion and a circuit holding member, the circuit holding member being for holding the electronic control unit and a filling material therein, the electronic control unit held in the circuit holding member with the connector exposed outside of the case from the opening portion, the filling material filling a space between the electronic control unit and the circuit holding member to fix the electronic control unit to the circuit holding member.

2. The intake device of claim 1, wherein the case is divided by the element into a dusty side and a clean side such that the air flows from the dusty side to the clean side through the element, and wherein the circuit holding member is disposed on the clean side in the case.

3. The intake device of claim 1, wherein the filling material fills a gap between the connector of the electronic control unit and the opening portion of the case.

4. The intake device of claim 1, which is assembled steps of:

disposing the electronic control unit in the circuit holding member;

protruding the connector of the electronic control unit outside of the case through the opening portion;

supplying the filling material into the circuit holding member; and hardening the filling material to fix the electronic control unit to the circuit holding member.

5. An intake device for filtering air and supplying the air into an engine controlled by an electronic control unit having a circuit element and a connector electrically connected to the circuit element and protruding from the electronic control unit, comprising:

an air cleaner having an element for filtering the air;

a throttle communicating with the air cleaner for controlling a flow rate of the air;

a surge tank communicating with the air cleaner through the throttle; and an intake manifold communicating with the surge tank and for supplying the air into the engine, wherein one of the air cleaner, the throttle, the surge tank, and the intake manifold has an opening portion and a circuit holding member for holding the electronic control unit and a filling material, the electronic control unit held in the circuit holding member with the connector exposed outside through the opening portion, the filling material filling a space between the electronic control unit and the circuit holding member to fix the electronic control unit in the circuit holding member.

6. The intake device of claim 5, wherein the filling material fills a gap between the connector of the electronic control unit and the opening portion.

7. The intake device of claim 5, wherein the electronic control unit is covered with the filling material to expose the connector.

8. The intake device of claim 5, which is assembled in steps of:

disposing the electronic control unit in the circuit holding member;

supplying the filling material into the circuit holding member; and hardening the filling material to fix the electronic control unit to the circuit holding member.

* * * * *